US009198287B2

(12) United States Patent
Ueda et al.

(10) Patent No.: US 9,198,287 B2
(45) Date of Patent: Nov. 24, 2015

(54) SUBSTRATE WITH TRANSPARENT ELECTRODE, METHOD FOR MANUFACTURING THEREOF, AND TOUCH PANEL

(75) Inventors: Hiroaki Ueda, Otsu (JP); Takahisa Fujimoto, Settsu (JP); Kozo Kondo, Otsu (JP); Kenji Yamamoto, Settsu (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 14/007,969

(22) PCT Filed: Nov. 11, 2011

(86) PCT No.: PCT/JP2011/076118
§ 371 (c)(1),
(2), (4) Date: Sep. 26, 2013

(87) PCT Pub. No.: WO2013/069162
PCT Pub. Date: May 16, 2013

(65) Prior Publication Data
US 2014/0232951 A1    Aug. 21, 2014

(51) Int. Cl.
*G06F 3/042* (2006.01)
*B32B 7/02* (2006.01)
(Continued)

(52) U.S. Cl.
CPC .............. *H05K 1/0306* (2013.01); *C23C 14/08* (2013.01); *G02B 1/116* (2013.01); *G06F 3/041* (2013.01); *H05K 3/4688* (2013.01); *G06F 3/044* (2013.01); *G06F 2203/04103* (2013.01)

(58) Field of Classification Search
CPC .... G06F 3/041; H05K 1/0306; H05K 2/4688; G02B 1/115; C03C 17/3417

USPC ........ 174/255; 252/521.1; 313/506; 327/517; 333/193; 343/700 MS; 349/38; 428/203, 212, 216, 339; 438/597, 652; 257/57
See application file for complete search history.

(56) References Cited

U.S. PATENT DOCUMENTS

2004/0175577 A1*  9/2004  Lin et al. ................. 428/432
2010/0013784 A1    1/2010  Nashiki et al.
(Continued)

FOREIGN PATENT DOCUMENTS

| JP | 2010015861 A | 1/2010 |
| JP | 2010023282 A | 2/2010 |

(Continued)

OTHER PUBLICATIONS

International Bureau of WIPO, International Preliminary Report on Patentability of PCT/JP2011/076118, May 22, 2014, Switzerland, 5 pages.
(Continued)

*Primary Examiner* — Lin Li
(74) *Attorney, Agent, or Firm* — Alleman Hall McCoy Russell & Tuttle LLP (57) ABSTRACT

The substrate with a transparent electrode includes a first dielectric material layer mainly composed of $SiO_x$, a second dielectric material layer mainly composed of a metal oxide, a third dielectric material layer mainly composed of $SiO_y$, and a transparent electrode layer, in this order on a transparent film substrate. The transparent electrode layer is patterned to have an electrode layer-formed part and an electrode layer non-formed part. The transparent electrode layer is a layer mainly composed of an indium-tin composite oxide and having a thickness of 20 nm to 35 nm. The refractive index $n_1$ of the first dielectric material layer, the refractive index $n_2$ of the second dielectric material layer, and the refractive index $n_3$ of the third dielectric material layer satisfy $n_3<n_1<n_2$. The first dielectric material layer, the second dielectric material layer and the third dielectric material layer each have specific thicknesses.

8 Claims, 2 Drawing Sheets

(51) Int. Cl.

| | | |
|---|---|---|
| B32B 17/10 | (2006.01) | |
| H01L 21/44 | (2006.01) | |
| H01J 1/62 | (2006.01) | |
| H01J 63/04 | (2006.01) | |
| H01L 33/00 | (2010.01) | |
| B32B 15/00 | (2006.01) | |
| B32B 17/06 | (2006.01) | |
| H05K 1/03 | (2006.01) | |
| C23C 14/08 | (2006.01) | |
| G02B 1/116 | (2015.01) | |
| G06F 3/041 | (2006.01) | |
| H05K 3/46 | (2006.01) | |
| G06F 3/044 | (2006.01) | |

(56) References Cited

U.S. PATENT DOCUMENTS

| | | | | |
|---|---|---|---|---|
| 2010/0026180 | A1* | 2/2010 | Kobayashi | 313/506 |
| 2011/0217548 | A1* | 9/2011 | Nashiki et al. | 428/339 |
| 2011/0318553 | A1* | 12/2011 | Lotz | 428/212 |
| 2012/0049239 | A1* | 3/2012 | Sung | 257/103 |
| 2012/0052278 | A1* | 3/2012 | Nashiki et al. | 428/216 |
| 2012/0194482 | A1* | 8/2012 | Kim et al. | 345/176 |
| 2013/0005139 | A1* | 1/2013 | Krasnov et al. | 438/652 |

FOREIGN PATENT DOCUMENTS

| | | | | |
|---|---|---|---|---|
| JP | 2010069675 A | | 4/2010 | |
| JP | 2010184477 A | | 8/2010 | |
| WO | WO 2009/050840 | * | 8/2008 | ............ H01L 21/316 |
| WO | WO 2009/050840 | * | 4/2009 | ............ H01L 21/316 |
| WO | 2011048648 A1 | | 4/2011 | |

OTHER PUBLICATIONS

Japanese Patent Office, International Search Report of PCT/JP2011/076118, WIPO, Feb. 14, 2012, 1 pages.

* cited by examiner

Fig. 1

Fig. 2 (a) Example 3

Fig. 2 (b) Comparative Example 2

SUBSTRATE WITH TRANSPARENT ELECTRODE, METHOD FOR MANUFACTURING THEREOF, AND TOUCH PANEL

TECHNICAL FIELD

The invention relates to a substrate with a transparent electrode which is suitably used for a touch panel, and a manufacturing method thereof. The invention also relates to a touch panel having the substrate with a transparent electrode.

BACKGROUND ART

A substrate with a transparent electrode, in which a transparent electrode layer is formed on a transparent substrate such as a film or glass, is used as a transparent electrode of a display of a touch panel or the like. Particularly, when the substrate with a transparent electrode is used for position detection of a capacitance touch panel, the transparent electrode layer is finely patterned. As a patterning method, for example, a method is used in which after a transparent electrode layer is formed substantially over the entire surface of a transparent substrate, the transparent electrode layer is removed by etching or the like in a part of the plane. In this way, a substrate with a transparent electrode in which a transparent electrode layer patterned into an electrode layer-formed part (also referred to as a "non-etched part") and an electrode layer-non-formed part (also referred to as an "etched part") is formed on a substrate can be obtained.

For clearly displaying an image on a display, it is important to improve the transparency and chromaticity of the substrate with a transparent electrode. Further, in the substrate with a transparent electrode, in which the transparent electrode layer is patterned, it is required that the pattern of the transparent electrode layer be hardly visible.

For example, Patent Documents 1 and 2 propose a substrate with a transparent electrode in which a transparent electrode layer is formed on a transparent film substrate with two dielectric material layers interposed therebetween. Patent Document 1 proposes that by setting the thickness and refractive index of each dielectric material layer to specific values, a difference in transmittance and a $\Delta b^*$ between an electrode layer-formed part and an electrode layer-non-formed part are reduced. Patent Document 2 proposes that by setting the thickness and refractive index of each dielectric material layer to specific values, a difference in reflectance between an electrode layer-formed part and an electrode layer-non-formed part is reduced to suppress visibility of a pattern.

Here, the chromaticity is a value defined by JIS Z8730, and can be represented by a CIE lightness $L^*$ and color coordinates $a^*$ and $b^*$. The $a^*$ axis represents green to red, where the negative corresponds to green and the positive corresponds to red. The $b^*$ axis represents blue to yellow, where the negative corresponds to blue and the positive corresponds to yellow. A difference in chromaticity between two rays of light can be evaluated by a color difference $\Delta E$ represented by the following formula.

$$\Delta E = \{(\Delta L^*)^2 + (\Delta a^*)^2 + (\Delta b^*)^2\}^{1/2}$$

For suppressing visibility of the pattern of the transparent electrode layer, it is necessary that the color difference between the electrode layer-formed part and the electrode layer-non-formed part be small for both transmitted light and reflected light. As is evident from the above formula, it is required to reduce not only $\Delta b^*$ but also $\Delta L^*$ and $\Delta a^*$ for reducing the color difference $\Delta E$.

In Patent Document 1, $\Delta b^*$ of transmitted light is small, but a difference in transmittance at each wavelength range and $\Delta L^*$ and $\Delta a^*$ are not considered. Patent Document 2 discloses that a difference in reflectance in a wavelength range of 450 to 650 nm is reduced, but a difference in reflectance in wavelength ranges of 380 to 450 nm and 650 to 780 nm which are other visible light regions is not considered.

Patent Documents 3 and 4 disclose that a substrate with a transparent electrode, which includes three thin film layers having a specific thickness and a specific refractive index between a transparent film substrate and a transparent electrode, has a high transmittance and has transmitted light $b^*$ in a specific range. However, Patent Documents 3 and 4 disclose a substrate with a transparent electrode, which is principally used in a resistive touch panel, and do not discuss visibility of a pattern when the transparent electrode layer is patterned.

PRIOR ART DOCUMENTS

Patent Documents

Patent Document 1: JP-A-2010-15861
Patent Document 2: JP-A-2010-23282
Patent Document 3: JP-A-2010-184477
Patent Document 4: JP-A-2010-69675

SUMMARY OF THE INVENTION

Problems to be Solved by the Invention

The inventors patterned a transparent electrode layer of a substrate with a transparent electrode which included three thin film layers as disclosed in Patent Documents 3 and 4, and determined the visibility of the pattern. As a result, it was found that for both reflected light and transmitted light, there was a large color difference $\Delta E$ between an electrode layer-formed part and an electrode layer-non-formed part, and the pattern was visible.

A substrate with a transparent electrode, which had a patterned transparent electroconductive layer on a film substrate, had creases along the pattern of the transparent electrode layer. Consequently, it was found that the pattern tended to be more easily visible when light was reflected in conformity with the shape of creases.

In view of the above-mentioned situations, an object of the present invention is to provide a substrate with a transparent electrode in which a color difference of transmitted light and a color difference of reflected light between an electrode layer-formed part and an electrode layer-non-formed part is reduced, and generation of creases along a pattern of a transparent electrode layer is suppressed, so that the pattern is hardly visible.

Means for Solving the Problems

The inventors have conducted intensive studies, and resultantly found that the above-mentioned problems are solved when a dielectric material layer having a specific refractive index and a specific thickness is provided between a transparent film substrate and a transparent electrode layer, and the transparent electrode layer has a specific refractive index and a specific resistivity.

The present invention relates to a substrate with a transparent electrode which has a first dielectric material layer, a second dielectric material layer, a third dielectric material layer and a patterned transparent electrode layer in this order on at least one of the surfaces of a transparent film substrate.

The first dielectric material layer is a silicon oxide layer having a thickness of 1 nm to 25 nm. The second dielectric material layer is a metal oxide layer containing as a main component at least one oxide of a metal selected from the group consisting of Nb, Ta, Ti, Zr, Zn and Hf and having a thickness of 5 nm or more and less than 10 nm. The third dielectric material layer is a silicon oxide layer having a thickness of 35 nm to 55 nm. The transparent electrode layer is a layer containing an indium/tin composite oxide as a main component and having a thickness of 20 nm to 35 nm. The refractive index $n_1$ of the first dielectric material layer, the refractive index $n_2$ of the second dielectric material layer and the refractive index $n_3$ of the third dielectric material layer satisfy the relationship of $n_3<n_1<n_2$. When the silicon oxide as a main component of the first dielectric material layer is $SiO_x$, and the silicon oxide as a main component of the third dielectric material layer is $SiO_y$, $1.5 \leq x<y$ is satisfied.

The transparent electrode layer has a refractive index $n_4$ of 1.88 or less and a resistivity of $5.0\times10^{-4}$ Ω·cm or less. The transparent electrode layer preferably contains tin oxide in an amount of 4 parts by weight to 14 parts by weight based on 100 parts by weight of the sum of indium oxide and tin oxide.

In the present invention, an arithmetic mean roughness Ra of the third dielectric material layer is preferably 1 nm or less. The second dielectric material layer is preferably a metal oxide layer containing $Nb_2O_5$ as a main component.

Further, the present invention relates to a method for manufacturing the substrate with a transparent electrode. The substrate with a transparent electrode according to the present invention can be manufactured by forming on a transparent film substrate a first dielectric material layer, a second dielectric material layer, a third dielectric material layer and a transparent electrode layer in this order. Preferably, the third dielectric material layer is formed under a pressure of less than 0.4 Pa by a sputtering method. Preferably, the first dielectric material layer is also formed under a pressure of less than 0.4 Pa by a sputtering method.

Effects of the Invention

In a substrate with a transparent electrode according to the present invention, a color difference of transmitted light and a color difference of reflected light between an electrode layer-formed part and an electrode layer-non-formed part are small, and generation of creases along a pattern of a transparent electrode layer is suppressed. Therefore, visibility of the pattern of the transparent electrode layer is suppressed. The substrate with a transparent electrode according to the present invention is suitably used in a capacitance touch panel because visibility of the pattern is suppressed and the transparent electrode layer has a low resistance.

Figure 1:
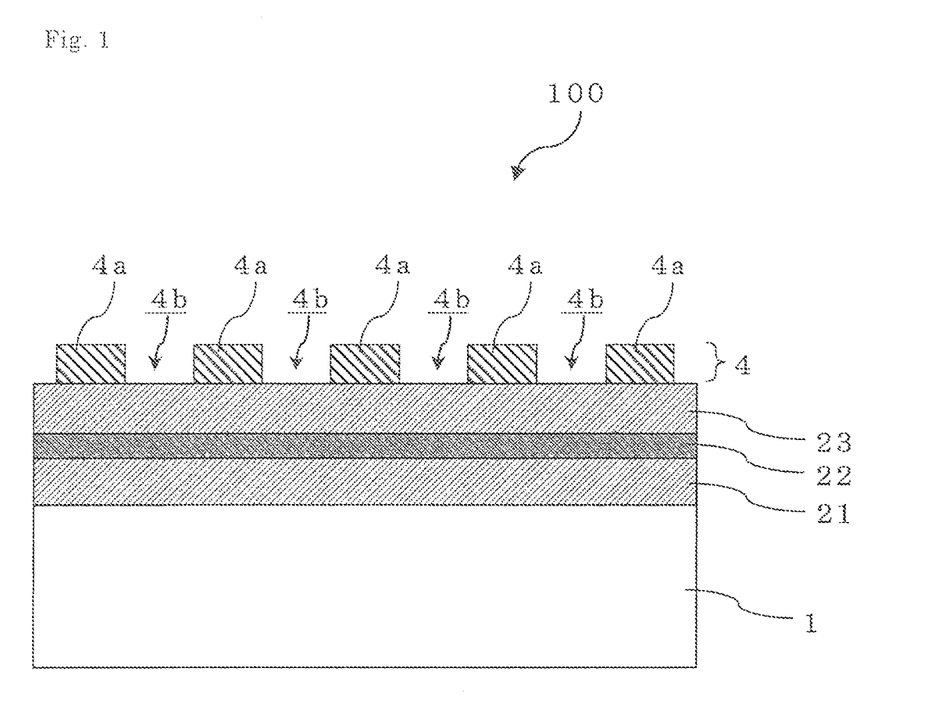
FIG. 1 is a schematic sectional view of a substrate with a transparent electrode according to one embodiment.

Preferred embodiments of the present invention will be described below with reference to the drawings. FIG. 1 shows a substrate 100 with a transparent electrode, which has on a transparent film substrate 1 a first dielectric material layer 21 having a refractive index $n_1$, a second dielectric material layer 22 having a refractive index $n_2$, a third dielectric material layer 23 having a refractive index $n_3$ and a transparent electrode layer 4 having a refractive index $n_4$ in this order. The transparent electrode layer 4 is patterned into an electrode layer-formed part 4a and an electrode layer-non-formed part 4b. This substrate with a transparent electrode is formed by, for example, forming the first dielectric material layer 21, the second dielectric material layer 22, the third dielectric material layer 23 and the transparent electrode layer 4 on the transparent film substrate 1, and then patterning the transparent electrode layer 4 by etching or the like.

The material of the transparent film substrate 1 is not particularly limited as long as it is colorless and transparent at least in a visible light region, and is heat resistant at a transparent electrode layer formation temperature. Example materials of the transparent film substrate include polyester resins such as polyethylene terephthalate (PET), polybutylene terephthalate (PBT) and polyethylene naphthalate (PEN), a cycloolefin-based resin, a polycarbonate resin, a polyimide resin and a cellulose-based resin. Among them, polyethylene terephthalate and the cycloolefin-based resin are suitably used.

The thickness of the transparent film substrate 1 is not particularly limited, but is preferably 10 μm to 400 μm, more preferably 50 μm to 300 μm. When the thickness falls within the above-mentioned range, the transparent film substrate 1 can have durability and appropriate flexibility, and therefore each dielectric material layer and the transparent electrode layer can be formed thereon with good productivity by a roll-to-roll method.

The transparent film substrate 1 may have a functional layer (not shown) such as a hard coat layer on one or both of the surfaces of a transparent film. For the film substrate to have proper durability and flexibility, the thickness of the hard coat layer is preferably 3 to 10 μm, more preferably 3 to 8 μm, further preferably 5 to 8 μm. The material of the hard coat layer is not particularly limited. Urethane-based resin, acrylic resin, silicone-based resin or the like being applied and cured can be appropriately used.

On the transparent film substrate 1, the first dielectric material layer 21, the second dielectric material layer 22 and the third dielectric material layer 23 are formed in this order. For the purpose of enhancing adhesion between the film substrate and the dielectric material layer, the surface of the transparent film substrate may be subjected to a surface treatment such as a corona discharge treatment or a plasma treatment prior to formation of the first dielectric material layer.

In the present invention, the refractive index $n_1$ of the first dielectric material layer, the refractive index $n_2$ of second dielectric material layer and the refractive index $n_3$ of the third dielectric material layer satisfy the relationship of $n_3<n_1<n_2$. When the magnitudes of the refractive indexes of the dielectric material layers satisfy this relationship, the reflectance at the interface between dielectric material layers is appropriately controlled, so that a substrate with a transparent electrode, which is excellent in visibility, is obtained. The refractive index of each of the dielectric material layers and the transparent electrode layer is a refractive index for light having a wavelength of 550 nm, which is measured by spectroscopic ellipsometry. The thickness of each layer is determined by transmission electron microscope (TEM) observation of a cross section.

As the first dielectric material layer, a silicon oxide layer containing $SiO_x$ as a main component is formed. In this specification, "containing a substance as a main component" means that the content of the substance is 51% by weight or more, preferably 70% by weight or more, more preferably 90% or more by weight. Each layer may contain components other than the main component as long as the feature of the present invention is not impaired.

The thickness $d_1$ of the first dielectric material layer 21 is 1 nm to 25 nm. $d_1$ is preferably 2 nm or more, more preferably 3 nm or more, further preferably 4 nm or more. $d_1$ is preferably 22 nm or less, more preferably 20 nm or less, further preferably 15 nm or less. The refractive index $n_1$ of the first dielectric material layer is preferably 1.45 to 1.95, more preferably 1.47 to 1.85, further preferably 1.49 to 1.75.

In the present invention, a silicon oxide layer as the first dielectric material layer 21 is present between the transparent film substrate 1 and the second dielectric material layer 22 as a high-refractive index layer, and thus a color difference ΔE between the electrode layer-formed part and the electrode layer-non-formed part is reduced, so that visibility of the pattern is suppressed. In the case where the high-refractive index layer is formed directly on the transparent film substrate, creases along the pattern tend to be generated when the transparent electrode layer is patterned. On the other hand, in the present invention, a silicon oxide layer is formed on the transparent film substrate 1 to suppress generation of pattern creases when the transparent electrode layer is patterned, so that the pattern is hardly visible.

A metal oxide layer is formed as the second dielectric material layer 22. The thickness $d_2$ of the second dielectric material layer 22 is 5 nm or more and less than 10 nm. $d_2$ is preferably 6 nm to 9 nm. When the thickness $d_2$ of the second dielectric material layer 22 falls within the above-mentioned range, reflectance difference and transmittance difference in a visible light short wavelength region between the electrode layer-formed part and the electrode layer-non-formed part are reduced, and thus color differences of both transmitted light and reflected light may be reduced. The refractive index $n_2$ of the second dielectric material layer is preferably 2.00 to 2.35, more preferably 2.05 to 2.30, further preferably 2.10 to 2.25. As a metal oxide having the above-mentioned refractive index, a metal oxide containing as a main component an oxide of a metal selected from the group consisting of Nb, Ta, Ti, Zr, Zn and Hf, or a composite oxide of these metals is preferred. Preferably, the second dielectric material layer 22 has low absorption of visible light in a short wavelength region. From such a viewpoint, the material of the second dielectric material layer 22 is preferably niobium oxide ($Nb_2O_5$), tantalum oxide ($Ta_2O_5$), titanium oxide ($TiO_2$) or zirconium oxide ($ZrO_2$), and particularly niobium oxide is suitably used. The above-mentioned material has a high transmittance on the short wavelength side as compared to metal oxides such as indium oxide, tin oxide and cerium oxide, or composite metal oxides thereof, so that b* of transmitted light and reflected light of the substrate with a transparent electrode is easily adjusted to fall within a preferred range.

As the third dielectric material layer, a silicon oxide layer containing $SiO_y$ as a main component is formed. Here, the silicon oxide $SiO_y$ used in the third dielectric material layer has an oxygen content higher than that of the silicon oxide $SiO_x$ used in the first dielectric material layer. In other words, y>x is satisfied. The silicon oxide generally has a refractive index that decreases as the oxygen content increases, and therefore by satisfying y>x, the refractive index $n_3$ of the third dielectric material layer can be made less than the refractive index $n_1$ of the first dielectric material layer. For the refractive index $n_1$ of the first dielectric material layer to fall within the above-mentioned preferred range, x≥1.5 is satisfied. That is, the composition ratios x and y of oxygen of $SiO_x$ as a main component of the first dielectric material layer and $SiO_y$ as a main component of the third dielectric material layer satisfy 1.5≤x<y. Since the stoichiometric composition of the silicon oxide is $SiO_2$, the theoretical upper limit of y is 2.

The thickness $d_3$ of the third dielectric material layer 23 is 35 nm to 55 nm. $d_3$ is preferably 40 nm or more, more preferably 45 nm or more. $d_3$ is preferably 52 nm or less, more preferably 50 nm or less. The refractive index $n_3$ of the third dielectric material layer is preferably 1.43 to 1.51, more preferably 1.45 to 1.50, further preferably 1.47 to 1.49.

The arithmetic mean roughness Ra of the third dielectric material layer 23 at the interface on the transparent electrode layer formation side is preferably 1 nm or less, more preferably 0.8 nm or less, further preferably 0.6 nm or less. When the surface of the third dielectric material layer is made smooth, crystallization of the transparent electrode layer 4 that is formed thereon tends to be promoted, leading to a reduction in refractive index and resistivity. The arithmetic mean roughness Ra is calculated in accordance with JIS B0601: 2001 (ISO 1302: 2002) on the basis of a surface shape (roughness curve) measured by a non-contact method using a scanning probe microscope.

In the substrate with a transparent electrode according to the present invention, the refractive index and thickness of each dielectric material layer are each adjusted to fall within the above-mentioned range, and thus multiple interference of light at the interface is properly controlled. Accordingly, the color differences of transmitted light and reflected light between the electrode layer-formed part 4a and the electrode layer-non-formed part 4b is reduced, so that visibility of the pattern of the transparent electrode layer is suppressed.

For more effectively inhibiting visibility of the pattern of the transparent electrode layer, an optical thickness $n_1 d_1$ represented by a product of the refractive index $n_1$ and the thickness $d_1$ of the first dielectric material layer is preferably 2 nm to 40 nm. $n_1 d_1$ is more preferably 4 nm or more, further preferably 6 nm or more. $n_1 d_1$ is more preferably 36 nm or less, further preferably 32 nm or less. Similarly, $n_2 d_2$ is preferably 12 nm or more, more preferably 13 nm or more. $n_2 d_2$ is preferably 19 nm or less, more preferably 18 nm or less. An optical thickness $n_3 d_3$ of the third dielectric material layer is preferably 50 nm to 80 nm. $n_3 d_3$ is more preferably 55 nm or more, further preferably 60 nm or more. $n_3 d_3$ is more preferably 75 nm or less, further preferably 70 nm or less.

As the transparent electrode layer 4, conductive oxide material layer containing indium-tin composite oxide as a main component is formed. The thickness $d_4$ of the transparent electrode layer 4 is 20 nm to 35 nm. $d_4$ is preferably 22 nm or more, more preferably 24 nm or more Further, $d_4$ is preferably 32 nm or less, more preferably 29 nm or less. When the thickness of the transparent electrode layer is set to 20 nm or more, the resistance of the transparent electrode is expected to be reduced. When the thickness of the transparent electrode layer is set to 35 nm or less, both of a reduction of color difference and an improvement of transparency are expected.

The refractive index $n_4$ of the transparent electrode layer is 1.88 or less. When the refractive index of the transparent electrode layer is decreased, the transparent electrode layer tends to have a reduced resistance. When a low-refractive index transparent electrode layer is formed on the third dielectric material layer, generation of pattern creases after the transparent electrode layer is patterned by etching or the like tends to be suppressed. $n_4$ is preferably 1.86 or less, more preferably 1.84 or less. The lower limit of $n_4$ is not particularly limited. As described in Patent Documents 1 to 4, the refractive index of the ITO thin film formed on the film substrate is generally 1.90 or more, but in the present invention, ITO having a lower refractive index as compared to these prior techniques is formed, so that the transparent electrode layer has a reduced resistance and generation of pattern creases is suppressed.

Preferably, the refractive index $n_4$ of the transparent electrode layer 4 is smaller than the refractive index $n_2$ of the second dielectric material layer and larger than the refractive index $n_1$ of the first dielectric material layer from the viewpoint of suppressing visibility of the pattern. In other words, preferably, the refractive indexes of the layers of the substrate with a transparent electrode according to the present invention satisfy the relationship of $n_3<n_1<n_4<n_2$. As described in detail later, the refractive index $n_4$ of the transparent electrode layer can be made to fall within the above-mentioned range by adjusting the content of tin oxide in ITO, formation conditions and surface roughness of the dielectric material layer as a ground layer of the transparent electrode layer, and so on.

The resistivity of the transparent electrode layer 4 is preferably $5.0\times10^{-4}$ $\Omega\cdot cm$ or less, more preferably $4.5\times10^{-4}$ $\Omega\cdot cm$ or less, further preferably $3.5\times10^{-4}$ $\Omega\cdot cm$ or less. When the resistivity of the transparent electrode layer falls within the above-mentioned range, the response speed can be enhanced when the substrate with a transparent electrode is used for a capacitance touch panel. The sheet resistance of the transparent electrode layer is preferably 250 $\Omega/sq$ or less, more preferably 200 $\Omega/sq$ or less, further preferably 150 $\Omega/sq$ or less.

For the resistivity to fall within the above-mentioned range, the content of tin oxide in the transparent electrode layer is preferably 4 parts by weight to 14 parts by weight based on 100 parts by weight of the sum of indium oxide and tin oxide. Particularly, the tin oxide content is more preferably 5 parts by weight or more, and more preferably 10 parts by weight or less. When the content of tin oxide is 4 parts by weight or more, the density of carriers in the transparent electrode layer tends to be increased, leading to a reduction in resistance. On the other hand, when the content of tin oxide is 14 parts by weight or less, crystallization of ITO easily proceeds, so that the resistivity is easily decreased, and a reduction in transmittance tends to be suppressed.

The method for formation of the first dielectric material layer 21, the second dielectric material layer 22, the third dielectric material layer 23 and the transparent electrode layer is not particularly limited as long as a uniform thin film is formed. Examples of the film formation method include: PVD methods such as a sputtering method and a vapor deposition method, dry coating methods such as various kinds of CVD methods; and wet coating methods such as a spin coating method, a roll coating method, a spray coating method and a dipping coating method. Among the film formation methods described above, dry coating methods are preferred because a thin film at a nanometer level is easily formed. Particularly, the sputtering method is preferred in that the thickness of each layer is controlled in an order of several nanometers to suppress pattern visibility of the transparent electrode layer.

When each dielectric material layer is formed by the sputtering method, a metal, a metal oxide, a metal carbide or the like can be used as a target. As a power source, DC, RF or MF power source or the like can be used. MF power source is preferred from the viewpoint of productivity. The applied power during film formation is not particularly limited, but is preferably adjusted to the extent that excessive heat is not given to the transparent film substrate, and productivity is not impaired. Specifically, the power density during formation of the first dielectric material layer is preferably 0.5 to 10 $W/cm^2$, the power density during formation of the second dielectric material layer is preferably 0.5 to 8 $W/cm^2$, and the power density during formation of the third dielectric material layer is preferably 0.2 to 10 $W/cm^2$.

The pressure for formation of each dielectric material layer can be appropriately set. The third dielectric material layer 23 is preferably formed under a pressure of less than 0.4 Pa by the sputtering method. The pressure for formation of the third dielectric material layer is more preferably 0.35 Pa or less, further preferably 0.25 Pa or less. By decreasing the pressure for formation of the third dielectric material layer, the surface of the transparent electrode formation side can be made smooth to decrease the arithmetic mean roughness Ra. When the third dielectric material layer is formed at a low pressure of less than 0.4 Pa, the transparent electrode layer that is formed thereon tends to have a reduced refractive index and a reduced resistance.

Further, when the third dielectric material layer is formed under a low-pressure condition, generation of pattern creases when the transparent electrode layer that is formed thereon is patterned by etching or the like tends to be suppressed. The reason why pattern creases of the transparent electrode layer are suppressed by adjusting conditions for formation of the third dielectric material layer is not clear, but it is considered as one of the causes that the crystallinity, surface shape, surface property and the like of the third dielectric material layer as a ground layer affect film growth of the transparent electrode layer. For example, it is thought that the physical properties of the third dielectric material layer affect the crystallinity, internal residual stress and the like of an ITO film which forms the transparent electrode layer, so that the imbalance of interface stress between the electrode layer-formed part and the electrode layer-non-formed part is eliminated, thus contributing to suppression of pattern creases.

Further, the first dielectric material layer is also preferably formed under a pressure of less than 0.4 Pa by the sputtering method. The pressure for formation of the first dielectric material layer is more preferably 0.35 Pa or less, further preferably 0.25 Pa or less. By decreasing the pressure for formation of the first dielectric material layer, as well as decreasing the pressure for formation of the third dielectric material layer, generation of pattern creases tends to be suppressed. The reason why pattern creases of the transparent electrode layer are suppressed by adjusting conditions for formation of the first dielectric material layer is not clear, but it is considered as one of the causes that the crystallinity, surface shape, surface property and the like of the first dielectric material layer affect film growth of the third dielectric material layer and the transparent electrode layer via the second dielectric material layer.

When the transparent electrode layer 4 is formed by the sputtering method, a metal, a metal oxide or the like is used as a target. As an introduced gas that is used for film formation, a gas containing an inert gas such as argon as a main component is preferred. Here, "containing an inert gas as a main component" means that an inert gas such as argon is contained in an amount of 50% or more among gases that are used. The introduced gas may be an inert gas such as argon alone, or a mixed gas of two or more gases. Particularly, a mixed gas of argon and oxygen is preferred. The mixed gas of argon and oxygen contains oxygen preferably in an amount of 0.2 to 5% by volume, more preferably in an amount of 1.0 to 4% by volume. By supplying the above-mentioned volume of oxygen, the transparency and electrical conductivity of the transparent electrode layer can be improved. The mixed gas of argon and oxygen may contain other gases as long as the feature of the present invention is not impaired.

It is preferable to perform a heat treatment, after formation of an ITO film having a low refractive index and a low resistance as the transparent electrode layer. The heat treatment causes crystallization of ITO to proceed, so that the transparent electrode layer tends to have a reduced refractive index and a reduced resistance, and the transmittance tends to be increased. The heat treatment of the transparent electrode layer is performed, for example, in an oven at 120° C. to 150° C. for 30 to 60 minutes. Alternatively, the transparent electrode layer may be heated at a relatively low temperature for a long time, for example at 85° C. to 120° C. for 1 day to 3 days. The heat treatment of the transparent electrode layer may be performed before or after patterning of the transparent electrode layer. The heat treatment of the transparent electrode layer may also serve as a heat annealing treatment for formation of a touch panel, such as a heat treatment during formation of a route wiring. When the heat treatment of the transparent electroconductive layer is performed, preferably the refractive index $n_4$ of the transparent electroconductive layer after the heat treatment falls within the above-mentioned range. In this case, the refractive index of the transparent electroconductive layer before the heat treatment may be more than 1.88.

In the substrate 100 with a transparent electrode according to the present invention, the transparent electrode layer 4 is patterned into an electrode layer-formed part 4a and an electrode layer-non-formed part 4b. Patterning is performed by, for example, after the formation of the transparent electrode layer, removing the transparent electrode layer by etching or the like in a part of the plane.

The method for etching the transparent electrode layer may be either of a wet process and a dry process. The wet process is suitable in that only the transparent electrode layer 4 is easily and selectively removed. In the present invention, the thickness of each dielectric material layer is adjusted so that the color differences of transmitted light and the color difference of reflected light are decreased, and therefore it is preferred that when the transparent electrode layer 4 is patterned, the dielectric material layers are not removed, but only the transparent electrode layer 4 is selectively removed.

As the wet process, a photolithography method is preferred. A photoresist, a developer and a rinsing agent for use in photolithography can be arbitrarily selected as long as a specific pattern can be formed without affecting the transparent electrode layer 4. As an etchant, a liquid, which allows removal of the transparent electrode layer 4 and does not affect a silicon oxide of the third dielectric material layer, is suitably used.

In the substrate with a transparent electrode according to the present invention, the color difference of transmitted light and the color difference of reflected light between the electrode layer-formed part and the electrode layer-non-formed part are small, so that visibility of the pattern is inhibited. The color difference of transmitted light between the electrode layer-formed part and the electrode layer-non-formed part is preferably 0.8 or less, more preferably 0.4 or less, further preferably 0.3 or less, especially preferably 0.2 or less. The color difference of reflected light between the electrode layer-formed part and the electrode layer-non-formed part is preferably 2.4 or less, more preferably 1.9 or less, further preferably 1.6 or less, especially preferably 1.4 or less.

In the substrate with a transparent electrode according to the present invention, b* of transmitted light of the electrode layer-formed part is preferably −2 to 1, which indicates that light is blue to colorless, more preferably −1 to 0.5, in that the chromaticity of a screen during formation of a touch panel is improved.

In the substrate with a transparent electrode according to the present invention, the color difference between the electrode layer-formed part and the electrode layer-non-formed part is small, and a generation of creases along the pattern of the transparent electrode layer is hard to occur, so that pattern visibility is effectively suppressed.

The substrate with a transparent electrode according to the present invention may have other layers between the transparent film substrate 1 and the first dielectric material layer 21 and on the transparent electrode layer 4 or on the surface of the transparent film substrate 1 at the transparent electrode non-formed surface side as long as the feature of the present invention is not impaired. The substrate with a transparent electrode according to the present invention may have transparent electrode layers on both the surfaces of the film substrate 1. When transparent electrode layers are formed on both the surfaces of the film substrate 1 and if the first dielectric material layer 21, the second dielectric material layer 22 and the third dielectric material layer 23 are formed between one transparent electrode layer and the substrate, a layer configuration between the other transparent electrode layer and the substrate may be different from that described above.

The substrate with a transparent electrode according to the present invention is suitably used as a transparent electrode for a touch panel. Particularly, the substrate with a transparent electrode according to the present invention is suitably used for a capacitance touch panel because the pattern is hardly visible, and the transparent electrode layer has a low resistance.

In formation of a touch panel, an electroconductive ink or paste is applied onto the substrate with a transparent electrode, and heat treatment is performed to form a collecting electrode as wiring for a routing circuit. The heat treatment method is not particularly limited, and examples thereof include a method of heating using an oven, an IR heater or the like. The temperature/time for the heat treatment is appropriately set in consideration of a temperature/time that allows the electroconductive paste to be attached to the transparent electrode. Examples include a heat treatment at 120 to 150° C. for 30 to 60 minutes for heating by the oven, and a heat treatment at 150° C. for 5 minutes for heating by the IR heater. The method for formation of a wiring for routing circuit is not limited to the above-mentioned method, and the wiring may be formed by a dry coating method. When the wiring for a routing circuit is formed by photolithography, the wiring can be made thinner.

EXAMPLES

The present invention will be described more specifically below by showing examples, but the present invention is not limited to these examples.

For determining the refractive index of each of dielectric material layers and a transparent electrode layer, a refractive index value for light having a wavelength of 550 nm was determined by spectroscopic ellipsometry measurement and by performing fitting using a cauchy model and a tauc-lorentz model. In the measurement, a sample prepared by polishing the surface on the transparent electroconductive layer non-formed surface side was used in order to eliminate influences of light interference by a hard coat layer. In the fitting, a value determined by transmission electron microscope (TEM) observation of a cross section of a substrate with a transparent electrode was used for the thickness of each of the dielectric material layers and the transparent electrode layer. An accuracy of the fitting was checked by confirming that a transmittance and a reflectivity calculated by a simulation using measured values of the refractive index, extinction coefficient and thickness of each of the dielectric material layers and the transparent electroconductive layer were consistent with measured values by a spectrophotometer.

The surface resistance of the transparent electrode layer was measured by four-point probe measurement using a low resistivity meter Loresta GP (MCP-T710, manufactured by Mitsubishi Chemical Corporation). The resistivity of the transparent electroconductive layer was calculated from a product of the value of the above-mentioned surface resistance and the thickness. The transmittance and reflectivity of the substrate with a transparent electrode were measured using a spectrophotometer (U-4000, manufactured by Hitachi High-Technologies Corporation.). The color differences of reflected light and transmitted light was calculated in accordance with JIS Z8730.

The surface shape of the surface of the dielectric material layer was measured with a scanning probe microscope (Nano-R, manufactured by Pacific Nanotechnology, Inc.) using a sample cut to a 5 mm square. The arithmetic mean roughness Ra was calculated in accordance with JIS B0601: 2001 (ISO 1302: 2002) on the basis of a surface shape (roughness curve) measured in a range of 0.7 μm in a non-contact mode.

Visibility of a pattern and presence/absence of pattern creases for the substrate with a transparent electrode were each determined by visual inspection. For pattern visibility of transmitted light, the substrate with a transparent electrode, which was left standing on a light box in a dark room, was observed. A sample, for which presence/absence of the pattern could not be recognized, was rated A, and a sample, for which presence/absence of the pattern could be recognized, was rated B. For pattern visibility of reflected light, reflected light from the substrate with a transparent electrode was observed under a fluorescent lamp. A sample, for which presence/absence of the pattern could not be recognized, was rated A, and a sample, for which presence/absence of the pattern could be recognized, was rated B. For presence/absence of pattern creases, reflected light from a fluorescent lamp was observed while the substrate with a transparent electrode was arranged so that the pattern formation direction of the transparent electrode layer and reflected light from a straight tube fluorescent lamp were substantially orthogonal to each other. A sample, for which a reflected image of the fluorescent lamp seemed like a straight line, was rated A (creases absent), and a sample, for which the reflected image seemed distorted, was rated B (creases present).

Example 1

On one of the surfaces of a PET film having a thickness of 188 μm, which was provided on both the surfaces with hard coat layers (refractive index: 1.53) formed of a urethane-based resin, a first dielectric material layer, a second dielectric material layer, a third dielectric material layer and a transparent electrode layer were sequentially formed using a roll-to-roll-type wind up sputtering apparatus.

First, a $SiO_x$ layer was formed on the substrate as the first dielectric material layer. Using SiC as a target, sputtering was performed at a dynamic rate of 20.7 nm·m·min$^{-1}$ under conditions of a chamber pressure of 0.3 Pa, a substrate temperature of 25° C. and a power density of 3.0 W/cm$^2$ while an oxygen/argon (14 sccm/160 sccm) mixed gas was introduced into the chamber. The obtained $SiO_x$ layer had a thickness of 20 nm and a refractive index of 1.55.

On the first dielectric material layer, a niobium oxide layer was formed as the second dielectric material layer. Using niobium oxide (NbO) as a target, sputtering was performed at a dynamic rate of 12.6 nm·m·min$^{-1}$ under conditions of a chamber pressure of 0.2 Pa, a substrate temperature of 25° C. and a power density of 1.5 W/cm$^2$ while an oxygen/argon (5 sccm/100 sccm) mixed gas was introduced into the chamber. The obtained niobium oxide ($Nb_2O_5$) layer had a thickness of 7 nm and a refractive index of 2.18.

On the second dielectric material layer, a $SiO_2$ layer was formed as the third dielectric material layer. Using SiC as a target, sputtering was performed at a dynamic rate of 8.0 nm·m·min$^{-1}$ under conditions of a chamber pressure of 0.3 Pa, a substrate temperature of 25° C. and a power density of 3.0 W/cm$^2$ while an oxygen/argon (16 sccm/160 sccm) mixed gas was introduced into the chamber. The obtained $SiO_y$ layer had a thickness of 50 nm and a refractive index of 1.47. An arithmetic mean roughness Ra of this third dielectric material layer was 0.5 nm.

On the third dielectric material layer, an ITO layer was formed as the transparent electrode layer. Using indium-tin composite oxide (tin oxide content: 5 weight %) as a target, sputtering was performed at a dynamic rate of 32.5 nm·m·min$^{-1}$ under conditions of a chamber pressure of 0.3 Pa, a substrate temperature of 25° C. and a power density of 1.5 W/cm$^2$ while an oxygen/argon (2 sccm/160 sccm) mixed gas was introduced into the chamber. The obtained ITO layer had a thickness of 25 nm.

Thereafter, the transparent electrode layer was patterned by photolithography. First, a photoresist (trade name: TSMR-8900 (manufactured by TOKYO OHKA KOGYO Co., Ltd.)) was applied onto the transparent electrode layer with a thickness of about 2 μm by spin coating, and then pre-baked in an oven at 90° C. Ultraviolet light of 40 mJ was applied via a photomask. Thereafter, the photoresist layer was post-baked at 110° C., and patterning was performed using a developer (trade name: NMD-W (manufactured by TOKYO OHKA KOGYO Co., Ltd.)). Further, the transparent electrode layer was etched using an etchant (trade name: ITO 02 (manufactured by Kanto Chemical Co., Inc.)). Finally, a remaining photoresist was removed using a rinsing liquid (trade name: 104 (manufactured by TOKYO OHKA KOGYO Co., Ltd.)).

Thereafter, a heat-treatment was performed for 60 minutes in an oven at 150° C. The refractive index of the ITO layer after the heat-treatment was 1.85.

Examples 2 to 4 and Comparative Examples 1 and 2

The thickness of the second dielectric material layer was changed as shown in Table 1. In the same manner as in Example 1, except for this change, a first dielectric material layer, a second dielectric material layer, a third dielectric material layer and a transparent electrode layer were sequentially formed, and the transparent electrode layer was then patterned and heat-treatment was performed.

Examples 5 to 7 and Comparative Examples 3 and 4

The thickness of the third dielectric material layer was changed as shown in Table 1. In the same manner as in Example 1, except for this change, a first dielectric material layer, a second dielectric material layer, a third dielectric material layer and a transparent electrode layer were sequentially formed, and the transparent electrode layer was then patterned and heat-treatment was performed.

Example 8

The mixing ratio of the introduced gas during formation of the first dielectric material layer was changed to oxygen/argon=5 sccm/160 sccm, and sputtering was performed at a dynamic rate of 9.2 nm·m·min$^{-1}$. The obtained SiO$_x$ layer had a thickness of 5 nm and a refractive index of 1.75. In the same manner as in Example 1, except for these changes, a first dielectric material layer, a second dielectric material layer, a third dielectric material layer and a transparent electrode layer were sequentially formed, and the transparent electrode layer was then patterned and heat-treatment was performed.

Comparative Example 5

A first dielectric material layer, a second dielectric material layer, a third dielectric material layer and a transparent electrode layer were sequentially formed, and the transparent electrode layer was then patterned and heat-treatment was performed in the same manner as in Example 8 except that the first dielectric material layer was formed to have a thickness of 30 nm.

Example 9

A first dielectric material layer, a second dielectric material layer, a third dielectric material layer and a transparent electrode layer were sequentially formed, and the transparent electrode layer was then patterned and heat-treatment was performed in the same manner as in Example 1 except that a target having a tin oxide content of 10% by weight was used as a target for formation of the transparent electrode layer.

Example 10

A first dielectric material layer, a second dielectric material layer, a third dielectric material layer and a transparent electrode layer were sequentially formed, and the transparent electrode layer was then patterned and heat-treatment was performed in the same manner as in Example 9 except that the transparent electrode layer was formed to have a thickness of 30 nm.

Comparative Example 6

A first dielectric material layer, a second dielectric material layer, a third dielectric material layer and a transparent electrode layer were sequentially formed, and the transparent electrode layer was then patterned and heat-treatment was performed in the same manner as in Example 1 except that a target having a tin oxide content of 3% by weight was used as a target for formation of the transparent electrode layer.

Example 11 and Comparative Examples 7 and 10

By adjusting introduction amounts of argon and oxygen, the chamber pressures during formation of the first dielectric material layer and the third dielectric material layer were changed as shown in Table 1. In the same manner as in Example 1, except for this change, a first dielectric material layer, a second dielectric material layer, a third dielectric material layer and a transparent electrode layer were sequentially formed, and the transparent electrode layer was then patterned and heat-treatment was performed.

In Example 11 (pressure for formation of the first dielectric material layer and the third dielectric material layer: 0.3 Pa), Comparative Example 9 (pressure for formation of the first dielectric material layer and the third dielectric material layer: 0.5 Pa) and Comparative Example 10 (pressure for formation of the first dielectric material layer and the third dielectric material layer: 0.8 Pa), the arithmetic mean roughness of the third dielectric material layer was 0.7 nm, 1.3 nm and 4.5 nm, respectively. From comparison among Examples 1 and 11 and Comparative Examples 9 and 10, it is apparent that the surface becomes smoother as the pressure for formation of the third dielectric material layer decreases.

Comparative Example 11

The first dielectric material layer was not formed, and a niobium oxide layer was formed as the second dielectric material layer directly on a PET film provided with a hard coat layer. In the same manner as in Example 1 except for this change, a second dielectric material layer, a third dielectric material layer and a transparent electrode layer were sequentially formed, and the transparent electrode layer was then patterned and heat-treatment was performed.

Figure 2:
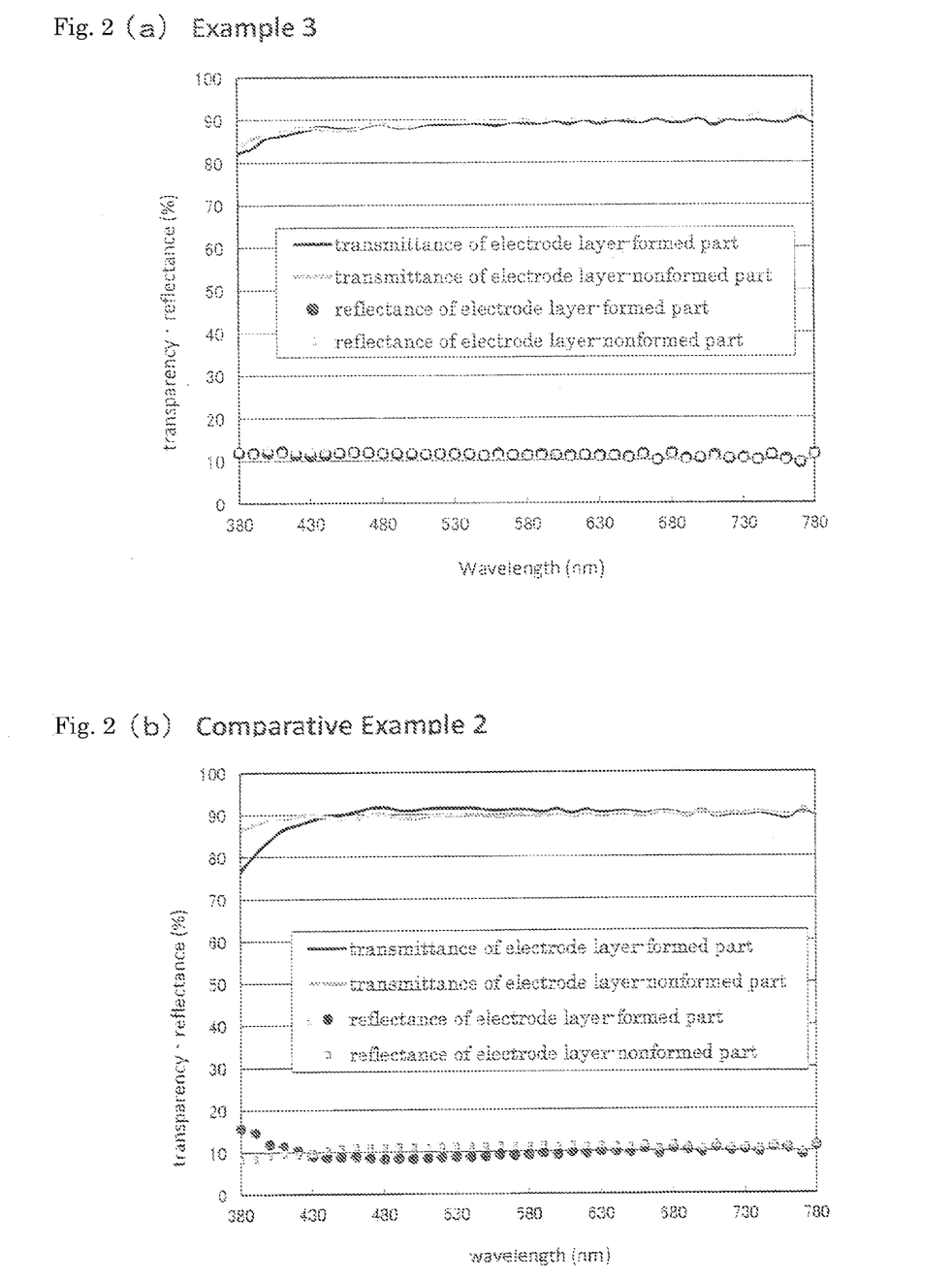
FIG. 2(a) is a spectrophotometric spectrum of the substrate with a transparent electrode in Example 3.
FIG. 2(b) is a spectrophotometric spectrum of the substrate with a transparent electrode in Comparative Example 2.

The refractive index and thickness of each layer, the conditions for formation of the first dielectric material layer and the third dielectric material layer, and the tin oxide content, sheet resistance and resistivity of the transparent electrode layer (ITO) for Examples and Comparative Examples described above are shown in Table 1. Visibility evaluation results (color difference and visual evaluation results) for each substrate with a transparent electrode are also shown in Table 1. In all Examples and Comparative Examples, the refractive index of the second dielectric material layer was 2.18 and the refractive index of the third dielectric material layer was 1.47. The spectrophotometric spectra of the substrates with a transparent electrode in Example 3 and Comparative Example 2 are shown in FIGS. 2(a) and 2(b), respectively.

TABLE 1

| | Layer structure | | | | | | | | | | | Visibility evaluation | | | | |
|---|---|---|---|---|---|---|---|---|---|---|---|---|---|---|---|---|
| | SiO$_x$ | | | Nb$_2$O$_5$ | SiO$_2$ | | ITO | | | | | transmitted light | | Reflected light | | |
| | | | formation | | formation | SnO$_2$ | | sheet thick- | resis- | resistivity | color | | color | | |
| | $n_1$ | $d_1$ nm | pressure Pa | $d_2$ nm | $d_3$ nm | pressure Pa | content wt % | $n_4$ | ness nm | tance Ω/sq | ×10$^{-4}$ Ω·cm | differ- ence | rating | differ- ence | rating | crease rating |
| Example 1 | 1.55 | 20 | 0.2 | 7 | 50 | 0.2 | 5 | 1.85 | 25 | 180 | 4.5 | 0.4 | A | 1.6 | A | A |
| Example 2 | 1.55 | 20 | 0.2 | 6 | 50 | 0.2 | 5 | 1.85 | 25 | 180 | 4.5 | 0.3 | A | 1.4 | A | A |
| Example 3 | 1.55 | 20 | 0.2 | 8 | 50 | 0.2 | 5 | 1.85 | 25 | 180 | 4.5 | 0.4 | A | 1.7 | A | A |
| Example 4 | 1.55 | 20 | 0.2 | 9 | 50 | 0.2 | 5 | 1.85 | 25 | 180 | 4.5 | 0.6 | A | 2.5 | A | A |
| Example 5 | 1.55 | 20 | 0.2 | 7 | 40 | 0.2 | 5 | 1.85 | 25 | 180 | 4.5 | 0.4 | A | 2.3 | A | A |
| Example 6 | 1.55 | 20 | 0.2 | 7 | 45 | 0.2 | 5 | 1.85 | 25 | 180 | 4.5 | 0.3 | A | 1.6 | A | A |
| Example 7 | 1.55 | 20 | 0.2 | 7 | 55 | 0.2 | 5 | 1.85 | 25 | 180 | 4.5 | 0.3 | A | 2.6 | A | A |
| Example 8 | 1.75 | 5 | 0.2 | 7 | 50 | 0.2 | 5 | 1.85 | 25 | 180 | 4.5 | 0.1 | A | 0.5 | A | A |

TABLE 1-continued

| | Layer structure | | | | | | | | | | Visibility evaluation | | | | |
| --- | --- | --- | --- | --- | --- | --- | --- | --- | --- | --- | --- | --- | --- | --- | --- |
| | SiO$_x$ | | | SiO$_2$ | | | ITO | | | | transmitted light | | Reflected light | | |
| | | | formation | Nb$_2$O$_5$ | | formation | SnO$_2$ | | sheet | | color | | color | | |
| | | | | | | | | thick- | resis- | resistivity | differ- | | differ- | | crease |
| | n$_1$ | d$_1$ nm | pressure Pa | d$_2$ nm | d$_3$ nm | pressure Pa | content wt % | n$_4$ | ness nm | tance Ω/sq | ×10$^{-4}$ Ω·cm | ence | rating | ence | rating | rating |
| Example 9 | 1.55 | 20 | 0.2 | 7 | 50 | 0.2 | 10 | 1.82 | 25 | 120 | 3.0 | 0.3 | A | 0.9 | A | A |
| Example 10 | 1.55 | 20 | 0.2 | 7 | 50 | 0.2 | 10 | 1.81 | 30 | 90 | 2.7 | 0.5 | A | 0.7 | A | A |
| Example 11 | 1.55 | 20 | 0.3 | 7 | 50 | 0.3 | 5 | 1.88 | 25 | 200 | 5.0 | 0.4 | A | 1.8 | A | A |
| Comparative Example 1 | 1.55 | 20 | 0.2 | 4 | 50 | 0.2 | 5 | 1.85 | 25 | 180 | 4.5 | 1.2 | B | 4.0 | B | A |
| Comparative Example 2 | 1.55 | 20 | 0.2 | 10 | 50 | 0.2 | 5 | 1.85 | 25 | 180 | 4.5 | 1.0 | B | 3.5 | B | A |
| Comparative Example 3 | 1.55 | 20 | 0.2 | 7 | 30 | 0.2 | 5 | 1.85 | 25 | 180 | 4.5 | 1.0 | B | 3.3 | B | A |
| Comparative Example 4 | 1.55 | 20 | 0.2 | 7 | 60 | 0.2 | 5 | 1.85 | 25 | 180 | 4.5 | 0.5 | A | 3.5 | B | A |
| Comparative Example 5 | 1.75 | 30 | 0.2 | 7 | 50 | 0.2 | 5 | 1.85 | 25 | 180 | 4.5 | 2.0 | B | 8.3 | B | A |
| Comparative Example 6 | 1.55 | 20 | 0.2 | 7 | 50 | 0.2 | 3 | 2.00 | 25 | 370 | 9.3 | 0.6 | A | 2.8 | A | B |
| Comparative Example 7 | 1.55 | 20 | 0.3 | 7 | 50 | 0.5 | 5 | 1.91 | 25 | 210 | 5.3 | 0.5 | A | 2.1 | A | B |
| Comparative Example 8 | 1.55 | 20 | 0.5 | 7 | 50 | 0.3 | 5 | 1.90 | 25 | 205 | 5.1 | 0.5 | A | 2.0 | A | B |
| Comparative Example 9 | 1.55 | 20 | 0.5 | 7 | 50 | 0.5 | 5 | 1.92 | 25 | 220 | 5.5 | 0.5 | A | 2.2 | A | B |
| Comparative Example 10 | 1.55 | 20 | 0.8 | 7 | 50 | 0.8 | 5 | 1.94 | 25 | 280 | 7.0 | 0.5 | A | 2.4 | A | B |
| Comparative Example 11 | | | | 7 | 50 | 0.2 | 5 | 1.85 | 25 | 180 | 4.5 | 0.3 | A | 0.9 | A | B |

According to Table 1, the substrate with a transparent electrode according to the present invention has a small color difference between the electrode layer-formed part and the electrode layer-non-formed part in both transmitted light and reflected light. Further, it is also apparent that in the substrate with a transparent electrode according to the present invention, generation of pattern creases is suppressed, and the pattern of the transparent electrode layer is hardly visible.

From comparison among Examples 1 to 4 and Comparative Examples 1 and 2, it is apparent that when the thickness of the second dielectric material layer falls within a specific range, the color differences of transmitted light and reflected light is reduced, so that the pattern of the transparent electrode layer is hardly visible.

According to FIGS. 2(a) and 2(b), in Comparative Example 2 (FIG. 2(b)) where the thickness of the second dielectric material layer is 10 nm, the transmittance of the electrode layer-formed part in the visible light short wavelength region is high, and b* of transmitted light is small. However, in Comparative Example 2, there is a difference in transmittance and reflectivity of visible light in the short wavelength region between the electrode layer-formed part and the electrode layer-non-formed part, and Δb* is large. Therefore, the pattern of the electrode layer is considered to be easily visible. On the other hand, it is apparent that in Example 3 (FIG. 2(a)) where the thickness of the second dielectric material layer is 8 nm, the difference in transmittance and the difference in reflectivity between the electrode layer-formed part and the electrode layer-non-formed part are small even in the short wavelength region, so that the pattern of the transparent electrode layer is hardly visible.

From comparison among Examples 1 and 5 to 7 and Comparative Examples 3 and 4, it is apparent that when the thickness of the third dielectric material layer falls within a specific range, the color differences of transmitted light and reflected light is reduced, so that the pattern of the transparent electrode layer is hard to be visible. From comparison among Examples 1 and 8 and Comparative Example 5, it is apparent that the refractive index and thickness of the first dielectric material layer also contribute to suppression of pattern visibility.

Thus, it is apparent that in the present invention, the material and thickness of each of the first dielectric material layer, the second dielectric material layer and the third dielectric material layer are adjusted to reduce the color difference between the electrode layer-formed part and electrode layer-non-formed part, so that visibility of the pattern of the transparent electrode layer is suppressed.

From comparison among Examples 1, 9 and 10 and Comparative Example 6, it is apparent that when the content of tin oxide in ITO is high, the transparent electrode layer has a reduced resistance and a reduced refractive index, and generation of pattern creases is suppressed. From these results, the content of tin oxide in ITO may be preferably 4% or more for suppressing generation of pattern creases.

From comparison among Examples 1 and 11 and Comparative Examples 9 and 10, it is apparent that when the pressure for formation of the third dielectric material layer is decreased, the surface of the third dielectric material layer becomes smooth, so that the transparent electrode layer which is formed thereon has a reduced resistance and a reduced refractive index, and generation of pattern creases is suppressed.

In Comparative Example 11 where the first dielectric material layer was not formed, and the second dielectric material layer was formed directly on the substrate, the color difference between the electrode layer-formed part and the electrode layer-non-formed part was small, but creases along the pattern of the transparent electrode layer were generated.

From comparison between Example 11 and Comparative Example 8, the former and the latter are different only in pressure for formation of the first dielectric material layer, whereas formation conditions of the third dielectric material layer and the transparent electrode layer are identical. Since in the transparent electrode layer of Example 11, the resistance and refractive index are low as compared to the transparent electrode of Comparative Example 8, and generation of pattern creases is suppressed, it is believed that in the present invention, not only the third dielectric material layer but also the first dielectric material layer contributes to reduction of the resistance of the transparent electrode layer and suppression of pattern creases.

DESCRIPTION OF REFERENCE CHARACTERS 1 transparent film substrate
21 first dielectric material layer
22 second dielectric material layer
23 third dielectric material layer
4 transparent electrode
4a electrode layer-formed part (non-etched part)
4b electrode layer-non-formed part (etched part)
100 substrate with transparent electrode

The invention claimed is:

1. A substrate with a transparent electrode, comprising: a transparent film substrate; and a first dielectric material layer, a second dielectric material layer, a third dielectric material layer and a patterned transparent electrode layer in this order on at least one surface of the transparent film substrate, wherein
the first dielectric material layer is a silicon oxide layer containing $SiO_x$ ($x \geq 1.5$) as a main component and having a thickness of 1 nm to 25 nm,
the second dielectric material layer is a metal oxide layer containing as a main component at least one oxide of a metal selected from the group consisting of Nb, Ta, Ti, Zr, Zn and Hf and having a thickness of 5 nm or more and less than 10 nm,
the third dielectric material layer is a silicon oxide layer containing $SiO_y$ ($y>x$) as a main component and having a thickness of 35 nm to 55 nm,
the transparent electrode layer is a conductive metal oxide layer containing an indium-tin composite oxide as a main component and having a thickness of 20 nm to 35 nm and patterned to have an electrode layer-formed part and an electrode layer non-formed part,
a refractive index $n_1$ of the first dielectric material layer, a refractive index $n_2$ of the second dielectric material layer and a refractive index $n_3$ of the third dielectric material layer satisfy a relationship of $n_3<n_1<n_2$, and
the transparent electrode layer has a refractive index $n_4$ of 1.88 or less and a resistivity of $5.0 \times 10^{-4}$ Ω·cm or less,
wherein a color difference of transmitted light between the electrode layer-formed part and the electrode layer non-formed part is 0.8 or less.

2. The substrate with transparent electrode according to claim 1, wherein the transparent electrode layer contains tin oxide in an amount of 4 parts by weight to 14 parts by weight based on 100 parts by weight of a sum of indium oxide and tin oxide.

3. The substrate with a transparent electrode according to claim 1, wherein an arithmetic mean roughness of the third dielectric material layer is 1 nm or less.

4. The substrate with a transparent electrode according to claim 1, wherein the second dielectric material layer is a metal oxide layer containing $Nb_2O_5$ as a main component.

5. The substrate with a transparent electrode according to claim 1, wherein a color difference of reflected light between the electrode layer-formed part and the electrode layer non-formed part is 2.4 or less.

6. A method for manufacturing a substrate with a transparent electrode, comprising the steps in the order of:
forming a first dielectric material layer of silicon oxide containing $SiO_x$ ($x \geq 1.5$) as a main component and having a thickness of 1 nm to 25 nm, on a surface of a transparent film substrate;
forming a second dielectric material layer of metal oxide containing as a main component at least one oxide of a metal selected from the group consisting of Nb, Ta, Ti, Zr, Zn, and Hf and having a thickness of 5 nm or more and less than 10 nm;
forming a third dielectric material layer of silicon oxide containing $SiO_y$ ($y>x$) as a main component and having a thickness of 35 nm to 55 nm; and
forming a transparent electrode layer of conductive metal oxide containing an indium tin composite oxide as a main component and having a thickness of 20 nm to 35 nm and patterned to have an electrode layer-formed part and an electrode layer non-formed part, wherein
a refractive index $n_1$ of the first dielectric material layer, a refractive index $n_2$ of the second dielectric material layer and a refractive index $n_3$ of the third dielectric material layer satisfy a relationship of $n_3<n_1<n_2$, and the transparent electrode layer has a refractive index of $n_4$ of 1.88 or less and a resistivity of $5.0 \times 10^{-4}$ Ω·cm or less, wherein
the third dielectric material layer is formed under a pressure of less than 0.4 Pa by a sputtering method,
and a color difference of transmitted light between the electrode layer-formed part and the electrode layer non-formed part is 0.8 or less.

7. The method for manufacturing a substrate with a transparent electrode according to claim 6, wherein the first dielectric material layer is formed under a pressure of less than 0.4 Pa by a sputtering method.

8. A touch panel including a substrate with a transparent electrode, wherein
the substrate with the transparent electrode comprises: a transparent film substrate; and a first dielectric material layer, a second dielectric material layer, a third dielectric material layer and a patterned transparent electrode layer in this order on at least one of the surfaces of the transparent film substrate, wherein
the first dielectric material layer is a silicon oxide layer containing $SiO_x$ ($x \geq 1.5$) as a main component and having a thickness of 1 nm to 25 nm,
the second dielectric material layer is a metal oxide layer containing as a main component at least one oxide of a metal selected from the group consisting of Nb, Ta, Ti, Zr, Zn and Hf and having a thickness of 5 nm or more and less than 10 nm,
the third dielectric material layer is a silicon oxide layer containing $SiO_y$ ($y>x$) as a main component and having a thickness of 35 nm to 55 nm,
the transparent electrode layer is a conductive metal oxide layer containing an indium-tin composite oxide as a main component and having a thickness of 20 nm to 35 nm and patterned to have an electrode layer-formed part and an electrode layer non-formed part,
a refractive index $n_1$ of the first dielectric material layer, a refractive index $n_2$ of the second dielectric material layer and a refractive index $n_3$ of the third dielectric material layer satisfy a relationship of $n_3<n_1<n_2$, and the transparent electrode layer has a refractive index $n_4$ of 1.88 or less and a resistivity of $5.0 \times 10^{-4}$ Ω·cm or less, wherein a color difference of transmitted light between the electrode layer-formed part and the electrode layer non-formed part is 0.8 or less.

* * * * *